United States Patent [19]

Kuramochi et al.

[11] Patent Number: 5,683,505
[45] Date of Patent: Nov. 4, 1997

[54] PROCESS FOR PRODUCING SINGLE CRYSTALS

[75] Inventors: Kaoru Kuramochi, Montgomery, Ohio; Setsuo Okamoto, Nishinomiya, Japan

[73] Assignee: Sumitomo Sitix Corporation, Amagasaki, Japan

[21] Appl. No.: 607,401

[22] Filed: Feb. 27, 1996

Related U.S. Application Data

[62] Division of Ser. No. 337,474, Nov. 8, 1994.

[51] Int. Cl.$^6$ ............................................. C30B 15/20
[52] U.S. Cl. .............................. 117/34; 117/13; 117/31; 117/313; 117/217
[58] Field of Search .............................. 117/13, 19, 20, 117/31, 34, 208, 210, 213, 215, 216, 217, 218; 373/156, 158, 163, 165; 432/65, 200

[56] References Cited

U.S. PATENT DOCUMENTS

| | | | |
|---|---|---|---|
| 4,097,329 | 6/1978 | Stock et al. | 117/13 |
| 4,330,361 | 5/1982 | Kuhń-Kuhnenfeld et al. | 117/13 |
| 4,330,362 | 5/1982 | Zulehner | 117/33 |
| 5,196,173 | 3/1993 | Arai et al. | 117/213 |
| 5,264,189 | 11/1993 | Yamashita et al. | 117/204 |
| 5,361,721 | 11/1994 | Tokano et al. | 117/208 |
| 5,363,795 | 11/1994 | Takawo et al. | 117/208 |
| 5,363,796 | 11/1994 | Kobayashi et al. | 117/30 |
| 5,373,805 | 12/1994 | Takano et al. | 117/13 |

FOREIGN PATENT DOCUMENTS

| | | |
|---|---|---|
| 62-138384 | 6/1987 | Japan . |
| 62-138385 | 6/1987 | Japan . |
| 62-138386 | 6/1987 | Japan . |
| 1-65086 | 3/1989 | Japan . |
| 1-72984 | 3/1989 | Japan . |
| 1-100086 | 4/1989 | Japan . |
| 1-100087 | 4/1989 | Japan . |
| 1-160892 | 6/1989 | Japan . |
| 3-88794 | 4/1991 | Japan . |

OTHER PUBLICATIONS

*Influence of Thermal History in CZ Crystal Growth Process on Dielectric Strength of Gate Oxide Films*, Y. Komatsu, T. Aoki, E. Kajita, M. Sano and T. Shigematsu, Extended Abstracts No. 30p-ZD-17, (The 39th Spring Meeting, Mar. 28–31, 1992); No. 1, The Japan Society of Applied Physics and Related Societies.

*Studies on Crystal Growing Conditions Concerning with Vox Failure*, K. Kitagawa, K. Yamashita, Y. Komatsu, K. Sano, N. Fujino and H. Murakami, Extended Abstracts No. 30P-ZL-8, (The 39th Spring Meeting, Mar. 28-31, 1991); No. 1, the Japan Society of Applied Physics and Related Societies.

Primary Examiner—Felisa Garrett
Attorney, Agent, or Firm—Burns, Doane, Swecker & Matthis, LLP

[57] ABSTRACT

A process for producing single crystals with little OSF generation and excellent dielectric strength of gate oxide films by adjusting the temperature gradient of the silicon single crystal in the direction of pulling. The process is carried out with an apparatus including a crucible which contains the melt of the single crystal material, a heating element which heats the melt, a pulling shaft to grow the single crystal, a protective gas inlet pipe, and a chamber which contains all above mentioned components. In addition, the apparatus is provided with a circular cylinder or a conical shaped heat resistant and heat insulating component below the protective gas inlet pipe. In the process of producing single crystals, the single crystal is pulled up through the circular cylinder or conical shaped heat resistant and heat insulating component below the protective gas inlet pipe, and while the pulled-up crystal is at high temperature the temperature gradient is held small and when the crystal is cooled to low temperature the temperature gradient is increased.

20 Claims, 6 Drawing Sheets

(a)

(b)

PROCESS FOR PRODUCING SINGLE CRYSTALS

This application is a divisional of application Ser. No. 08/337,474, filed Nov. 8, 1994 now allowed.

FIELD OF THE INVENTION

The present invention relates to an apparatus and a process for producing single crystals, specifically, an apparatus and a process for producing single crystals of high purity silicon which have few thermal oxidation induced stacking faults and excellent dielectric strength of gate oxide films.

DESCRIPTION OF THE PRIOR ART

A number of methods of producing single crystals for semiconductor application, particularly of producing high purity silicon single crystals are known. Single crystals produced according to Czochralski process, among others, contain appreciable amounts of oxygen which has been supplied from the quartz ($SiO_2$) that constitutes the crucible, as the crystals are grown by pulling up from the melt of silicon in the quartz crucible. Consequently, during the repetitive occurrence of heat treatments performed in the IC and LSI manufacturing process, slips and warpage seem to be prevented. Furthermore, an effect of gettering action of heavy metal contamination by the oxide precipitates (a phenomenon known as Intrinsic Gettering) is acknowledged. The Czochralski process is thus widely used in industrial production of silicon single crystals, in view of these process advantages.

FIG. 6 schematically illustrates the cross section of the apparatus and the pulling-process according to the Czochralski technique, where (1) is a crucible. The crucible (1) comprises a combination of a quartz crucible (1a) on the inside and a graphite crucible (1b) on the outside. A heating element (2) and a heat insulator (3) are mounted outside the crucible (1), in which the melt (6) of the material, the charge material for the crystal melted by the heating element, is contained. A seed crystal (2) which is mounted at the lower tip of a pulling shaft or a pulling wire is lowered until it makes contact with the surface of the melt (6) and then pulled upward to grow a single crystal (5) which is solidified from the melt beginning at the lower end of the seed. These parts and components are contained in a chamber provided with a water cooling device, all of which constitutes a whole apparatus for producing single crystals.

During the process of pulling the single crystal (5), high purity argon gas as a protective gas flows from the center of the subchamber (8) which is installed above the chamber (7). This gas flow forces out silicon monoxide (SiO) that evaporates from the surface of the silicon melt (6) to be discharged through the discharge port, which is not shown in the figure.

Since the argon gas flow in the chamber (7) is turbulent and locally stagnant, silicon monoxide is deposited on the ceiling of the metallic chamber (7) layer by layer or in particle form. Fine particles or small blocks of the deposited silicon monoxide fall onto the surface of the melt (6), and are incorporated in the boundary layer of the growing crystal and give rise to dislocations in the crystal, thus occasionally causing the single crystal to be rejected.

In addition, there are problems such as oxidation induced stacking faults, referred to as OSF hereinafter. These occur when high density integrated circuit components are formed on a silicon single crystal substrate. They are apt to be formed in the substrate and to deteriorate the characteristics of the electronic circuit components, after heat treatments at about 1000° C. in the device manufacturing process. The causes of OSF are presumably very small mechanical strains, nuclei of point defects generated in the heat treatment processes, or contaminations by heavy metal elements like sodium. Occurrence of OSF may be kept under control by adjusting the thermal history in the cooling process of the pulled single crystal after crystal solidification.

Various remedies have been proposed in order to cope with these problems. To mention a few;

① A single crystal is pulled up while flowing protective gas through an annulus formed with a pipe concentrically surrounding the pulled single crystal. A silicon single crystal rod is pulled up with an annular clearance of 15 to 35 mm down to 150 to 350 mm above the surface of the melt through which the protective gas at a pressure between 1 and 100 Torr may be introduced to the guard cylinder at a rate of 300 to 800N liter/h (See U.S. Pat. No. 4,097,329).

② The device schematically illustrated in FIG. 4 partly covers the crucible and the melt contained in it. It has an upper flat annular rim (8a) projecting beyond the crucible edge and a conical piece (8b) attached to this annular rim (8) and extending downward conically from its inner edge. The joining piece (8b) is 0.2 to 1.2 times as high as the depth of the crucible (1) (See U.S. Pat. No. 2,330,362).

③ The apparatus schematically illustrated in FIG. 5 is provided with a cylinder (19) which surrounds the pulled single crystal rod concentrically. The cylinder 19 characteristically has its one end tightly connected to the open edge at the center of the ceiling of the pulling chamber, and has the other end hung downward toward the surface of the melt in the quartz crucible with the collar (20) which is expanded and bent backward (See Laid-open (Kokai) No. 64-65086).

The above mentioned process and apparatus ① through ③ have certain effects in increasing the pulling rate of the single crystal, preventing the falling of fine particles of silicon monoxide onto the silicon melt, and in suppressing occurrence of OSF in the crystal substrate.

The exact mechanism of formation of faults, which deteriorate the dielectric strength of the oxide films, has not yet been clarified. While the dielectric strength of the oxide films depends on the growth rate of the single crystal, it is not governed by the pulling rate of the single crystal but has its basis on the thermal history during the crystal growth process. During the growth of the single crystal by pulling, defect nuclei which reduce the dielectric strength of the oxide films are generated in the crystal. It has been reported that these defect nuclei contract at high temperature (above 1250° C.) and grow at low temperature (below 1100° C.) (See 30P-ZD-17, The Japan Society of Applied Physics Extended Abstracts, The 39th Spring Meeting, 1992).

In the process ①, protective gas is introduced into the pulling zone of the single crystal, and its blow off effect prevents precipitation of silicon monoxide in the pulling zone. However, measures against OSF and for the dielectric strength of the oxide films have not been taken into consideration. As in the process ①, with the device ② no consideration has been taken about OSF or the dielectric strength of the oxide films. The structure is such that the internal height of the conical piece (8b) is as short as 0.2 to 1.2 times the crucible depth, so the pulled crystal is directly exposed to the low temperature atmosphere in the chamber, as soon as it is pulled up beyond the connection (8b). Since the pulled crystal is rapidly cooled at high temperature by the large cooling effect, the defect nuclei do not contract and the dielectric strength of the oxide films deteriorates.

With the apparatus (3), one end of the cylinder (19) which concentrically surrounds the pulled single crystal rod is tightly connected to the open edge at the center of the ceiling of the guard cylinder. Thus, the inside surface of the cylinder (19) is kept at a comparatively low temperature, releasing heat by conduction to the center of the water cooled ceiling. Therefore, the pulled crystal is rapidly cooled at high temperature by the cylinder (19) and the dielectric strength of the oxide films deteriorates.

Therefore, conventional apparatus for producing single crystals have had problems in that they are not suited for suppressing generation of OSF and for producing crystals with excellent dielectric strength of the oxide films.

OBJECTS OF THE INVENTION

The object of this invention is to provide an apparatus for pulling and growing single crystals which enables to adjust the temperature distribution in the direction of the single crystal pulling, in order to suppress generation of OSF, and to obtain excellent dielectric strength of the gate oxide films.

SUMMARY OF THE INVENTION

In summary, this invention provides (I) an apparatus for producing silicon single crystals and (II) a process for producing silicon single crystals as described below:

(I) An apparatus, shown in FIG. 1, for producing silicon single crystals is provided with a crucible (1) that contains the melt (6) for the single crystal to be grown, a heating element (2) that is to heat the melt, a pulling shaft that pulls up the single crystal (5) to be grown after making the seed crystal (4) contact the surface of the melt (6) in the crucible, a protective gas inlet pipe (9) that surrounds the pulled single crystal, and a chamber (7) that contains all the above mentioned components. In addition, the heat resistant and heat insulating component (10) characteristically is cylindrical or downward conically narrowing and installed surrounding the pulling zone of the single crystal, and is connected to the lower edge of the protective gas inlet pipe (9).

(II) A single crystal is grown by pulling up the crystal from the melt (6). The original crystal material is melted in the crucible (1), which is heated by the heating element (2). The heat resistant and heat insulating component (10) is installed around the grown single crystal (5). It (10) is fixed above the melt (6) and below the protective gas inlet pipe (9). The grown single crystal (5) is characteristically held with a small average temperature gradient at high temperature. Later, the temperature gradient is raised at low temperature.

BRIEF DESCRIPTION OF THE DRAWINGS

FIG. 2(a) is a longitudinal section, and FIG. 2(b) is a horizontal section.

DESCRIPTION OF THE INVENTION

This inventor has investigated in detail the measures of adjusting the thermal history and the temperature gradient of the single crystal during the crystal growth by pulling up the crystal in order to complete the apparatus for producing the silicon single crystal which has excellent dielectric strength of the gate oxide films and has little OSF generation, and has arrived at following findings:

(A) Producing a silicon single crystal with excellent dielectric strength of the gate oxide films is feasible by adjusting the thermal history to cool slowly at high temperature so that the defect nuclei shrink and disappear, namely by adjusting the cooling of the crystal from its solidification temperature so that the temperature gradient in the crystal at high temperature (above 1250° C.) may be small.

(B) It is feasible to obtain silicon single crystals with little OSF generation by adjusting the thermal history to cool rapidly at a low temperature range between 900° C. and 1100° C.

In order to obtain single crystals with little OSF generation and excellent dielectric strength of the gate oxide films, therefore, it is required that a small temperature gradient is realized at high temperature range (above 1250° C.), and then a large temperature gradient is formed at low temperature range (between 900° C. and 1100° C.) in the process of pulling up the single crystal.

(C) The temperature gradient in the direction of the crystal pulling is closely related to the inside surface temperature of the heat resistant and heat insulating component and the protective gas inlet pipe. If the inside surface temperature of the heat resistant and heat insulating component and the protective gas inlet pipe is low, the temperature gradient of the pulled crystal is increased, and if their temperature is high the temperature gradient is decreased.

This invention has been based on the above mentioned findings. The following will explain the apparatus in accordance with this invention in detail with the use of drawings.

Figure 1:
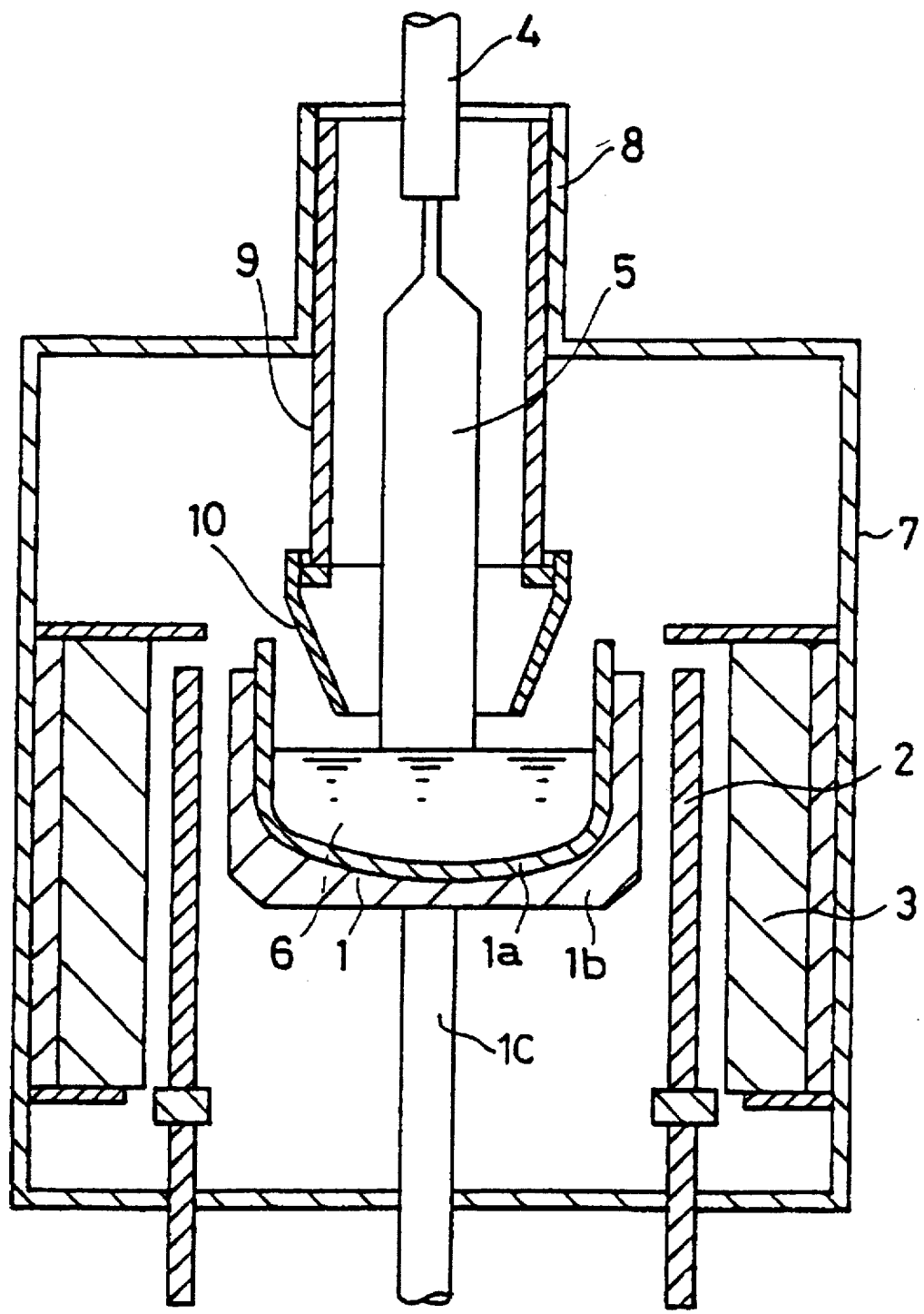
FIG. 1 is a schematic longitudinal section of an apparatus in accordance with this invention.

FIG. 1 illustrates a longitudinal section of an embodiment of the apparatus in accordance with this invention. The crucible is designated (1) in FIG. 1 and has a dual structure with a quartz crucible (1a) inside and a graphite crucible (1b) outside. The crucible is placed on a crucible shaft (1c), which can both be rotated and lifted.

The chamber (7) in FIG. 1 is a cylindrical vacuum chamber which has a pulling shaft of the single crystal along its center line and has the crucible (1) at its center. The heating element (2) and the heat insulator (3) are installed surrounding the crucible (1). The pulling shaft is suspended through the water cooled subchamber (8) and can be rotated and lifted. A seed crystal (2) is held at its lower end where a pulled crystal (5) is grown at its interface with the melt (6), as it is rotated and lifted.

A protective gas inlet pipe (9), which can be lifted, is installed surrounding the pulled crystal in the subchamber (8), and high purity argon gas as protective gas is introduced into the pulling zone during crystal pulling in order to prevent precipitation of silicon monoxide.

A cylindrical heat resistant and heat insulating component (10) also is installed surrounding the pulling zone of the single crystal suspended with the supporting components coaxially with the pulling shaft below the protective gas inlet pipe (9) and above the melt (6) in the crucible.

Figure 2:
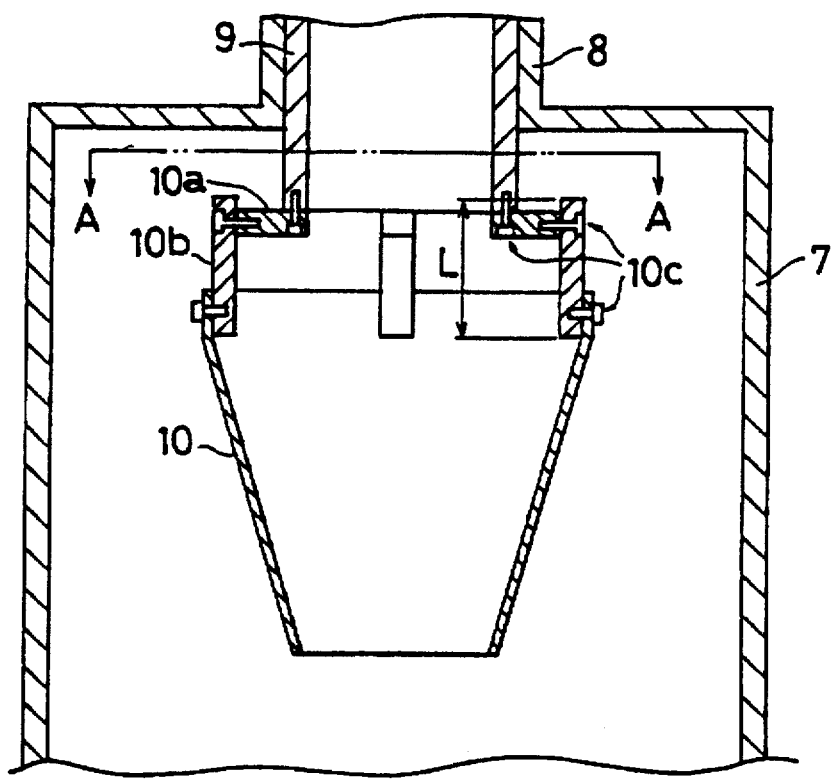
FIG. 2 shows how the heat resistant and heat insulating component is fixed to the protective gas inlet pipe.
Figure 2:
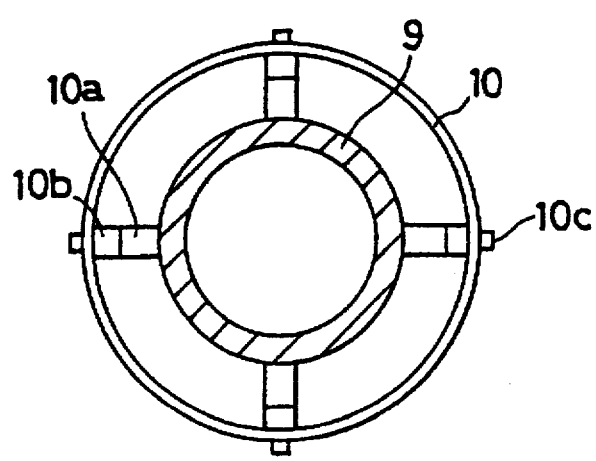

FIG. 2 shows how the heat resistant and heat insulating component (10) is suspended with the supporting components (10a) and (10b). FIG. 2(a) is a vertical section to show how supporting components (10a) and (10b) act, and FIG. 2(b) is the A—A view of the horizontal section. Four supporting components (10a) and (10b) are installed at 90° intervals below the protective gas inlet pipe (9) with the supporting components (10a) and (10b) fastening the upper end of the heat resistant and heat insulating component (10) with the fastening bolt (10c). The length of the supporting components (10a) is constant relative to the outside diameter of the protective gas inlet pipe (9), but the length of the supporting components (10b) (L in FIG. 2) can be varied by selection from several kinds of supporting components (10b).

The height of the heat resistant and heat insulating component (10) above the melt (6) and the gap between the lower end of the heat resistant and heat insulating component (10) and the surface of the melt (6) can be adjusted by selecting the length of the supporting components (10b) and with the lifting mechanism of the protective gas inlet pipe (9). This allows appropriate adjustment of the thermal history of the pulled single crystal. The number of supporting components (10a) is not limited to 4 as above, but can be either 3 or 6, for example. Furthermore, their cross section is not necessarily limited to the square or round shape as is illustrated.

Figure 3:
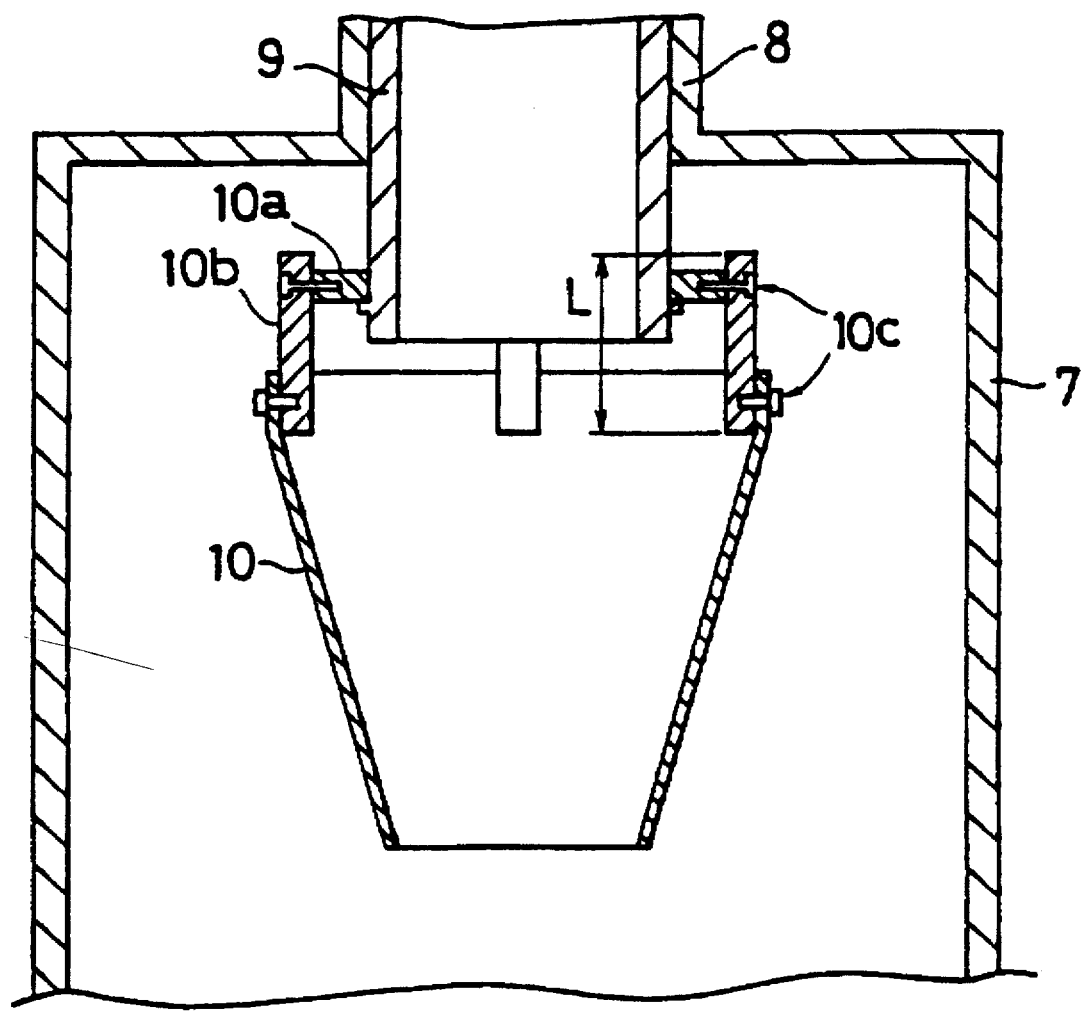
FIG. 3 shows another way to fix the heat resistant and heat insulating component to the protective gas inlet pipe.

FIG. 3 is another vertical section to show how to support the heat resistant and heat insulating component (10). FIG. 3 shows that the supporting components (10a) and (10b) can be installed not only at the bottom of the protective gas inlet pipe (9) but also at the side of the protective gas inlet pipe (9) and then the heat resistant and heat insulating component (10) can be connected to the lower part of the protective gas inlet pipe (9) via the supporting components (10a) and (10b).

The heat resistant and heat insulating component (10) is made of graphite. Its shape is either cylindrical or cylindrical narrowing downward, and its surface should preferably be coated with silicon carbide. High purity material of graphite is available, hence contamination of the pulled crystal with heavy metal elements can be avoided if the component (10) is made of graphite. Its surface is coated with silicon carbide, which prevents both the release of gas from the pores of the graphite component and the reaction of silicon monoxide evaporated from the melt 6 with the graphite component.

In an apparatus for producing single crystals like this, the rate of pulling the single crystal is influenced by the temperature gradient in its axial direction. If the temperature gradient at the interface between the growing solid and the melt of the pulled crystal (5) is increased, the rate of pulling can be increased. The temperature gradient at the interface between the growing solid and the melt is represented by dT/dX in the pulling direction, where the crystal temperature is T and its length in the pulling direction is X. The maximum pulling rate of the crystal Vmax can be represented by a function of the temperature gradient dT/dX below:

$$V_{max} = (k/h\rho) dT/dX$$

where
- k: the coefficient of thermal conductivity,
- h: the heat of fusion, and
- ρ: the density of the crystal.

It can be seen clearly that if the temperature gradient dT/dX increases the rate of pulling increases.

Consequently, it is necessary to adjust the temperature gradient of the pulled crystal appropriately in order to produce single crystals which have little OSF generation and excellent dielectric strength of the gate oxide films without loss of productivity in pulling crystal, namely, maintaining a high rate of pulling.

In the apparatus in accordance with this invention, the protective gas inlet pipe (9) is tightly connected with the water cooled subchamber (8), and the inside surface of the protective gas inlet pipe (9) is kept at low temperature by the release of heat by thermal conduction of the subchamber. The release of heat from the heat resistant and heat insulating component (10) to the protective gas inlet pipe (9) by thermal conduction is small, because the heat resistant and heat insulating component (10) is supported by the supporting component through the end of the side at the lower part of the protective gas inlet pipe (9). Further, the heat resistant and heat insulating component (10) receives a lot of radiative heat from the melt (6) and the heating element (2), and its inside surface is kept at high temperature, compared with the inside surface of the protective gas inlet pipe (9).

If pulling of the crystal is carried out in an apparatus like this, the temperature gradient at high temperature of the pulled crystal shortly after it solidifies is kept small in the heat resistant and heat insulating component (10), and the temperature gradient in the protective gas inlet pipe (9) at low temperature is adjusted to be large. Consequently, production of single crystals with little generation of OSF and excellent dielectric strength of the gate oxide films becomes possible by providing thermal history of rapidly cooling at low temperature after slowly cooling at high temperature during pulling process.

EXAMPLES

In the schematic drawing in FIG. 1 of the apparatus in accordance with this invention, the inside diameter of the protective gas inlet pipe (9) is 200 mm, and the heat resistant and heat insulating component (10) is a truncated cone with 250 mm in height, 440 mm in upper inside diameter, and 200 mm in lower inside diameter. The heat resistant and heat insulating component (10) is connected to the lower end of the protective gas inlet pipe (9) supported with the supporting components (10a) and (10b) with a gap of 40 mm between the bottom of the heat resistant and heat insulating component (10) and the surface of the melt (6). The heat resistant and heat insulating component (10) is made of graphite and its surface is coated with silicon carbide.

The pulled single crystal is a silicon single crystal of 6 inch diameter. A quartz crucible of 406 mm (16 inch) diameter is used. The argon gas flow rate into the metallic chamber is 60 liter/min. The crystal pulling rate is 1.0 mm/min, and the pulled rod length is 900 mm.

Figure 4:
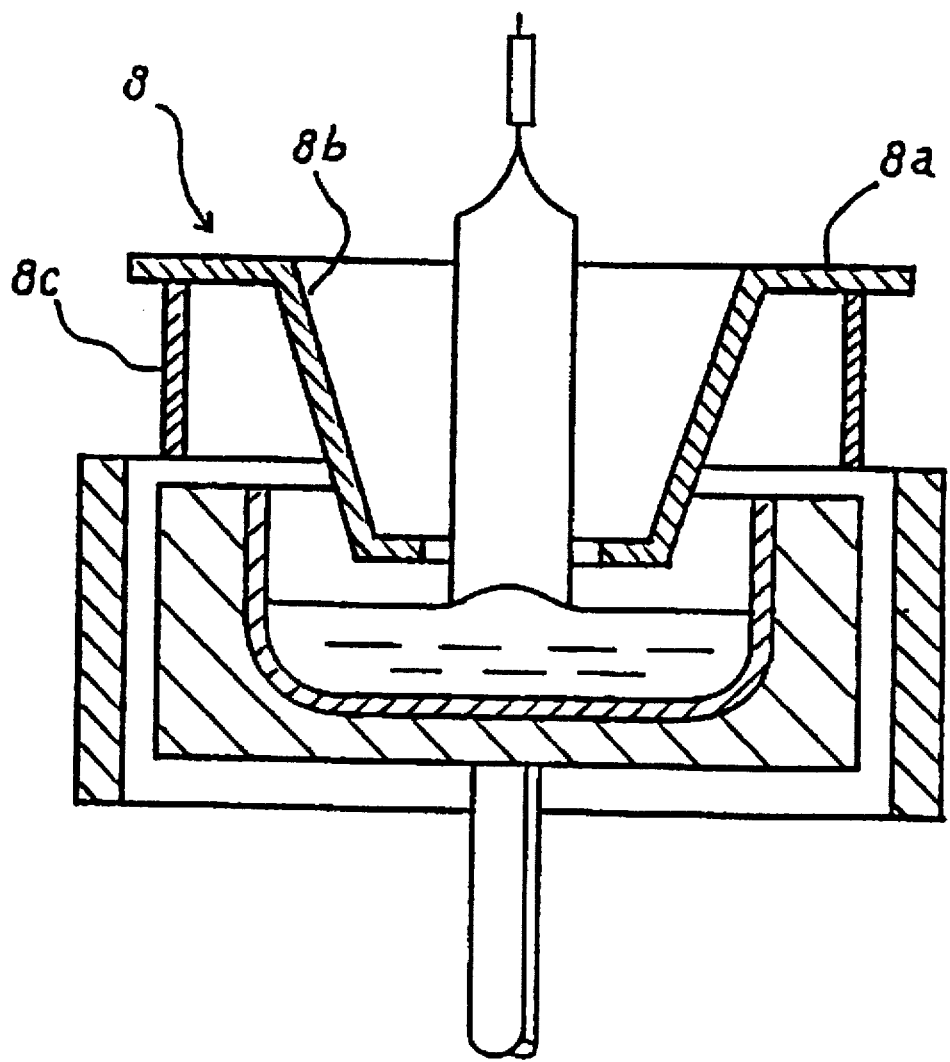
FIG. 4 is an illustration of a longitudinal section of an example of a conventional device for producing single crystals.
Figure 5:
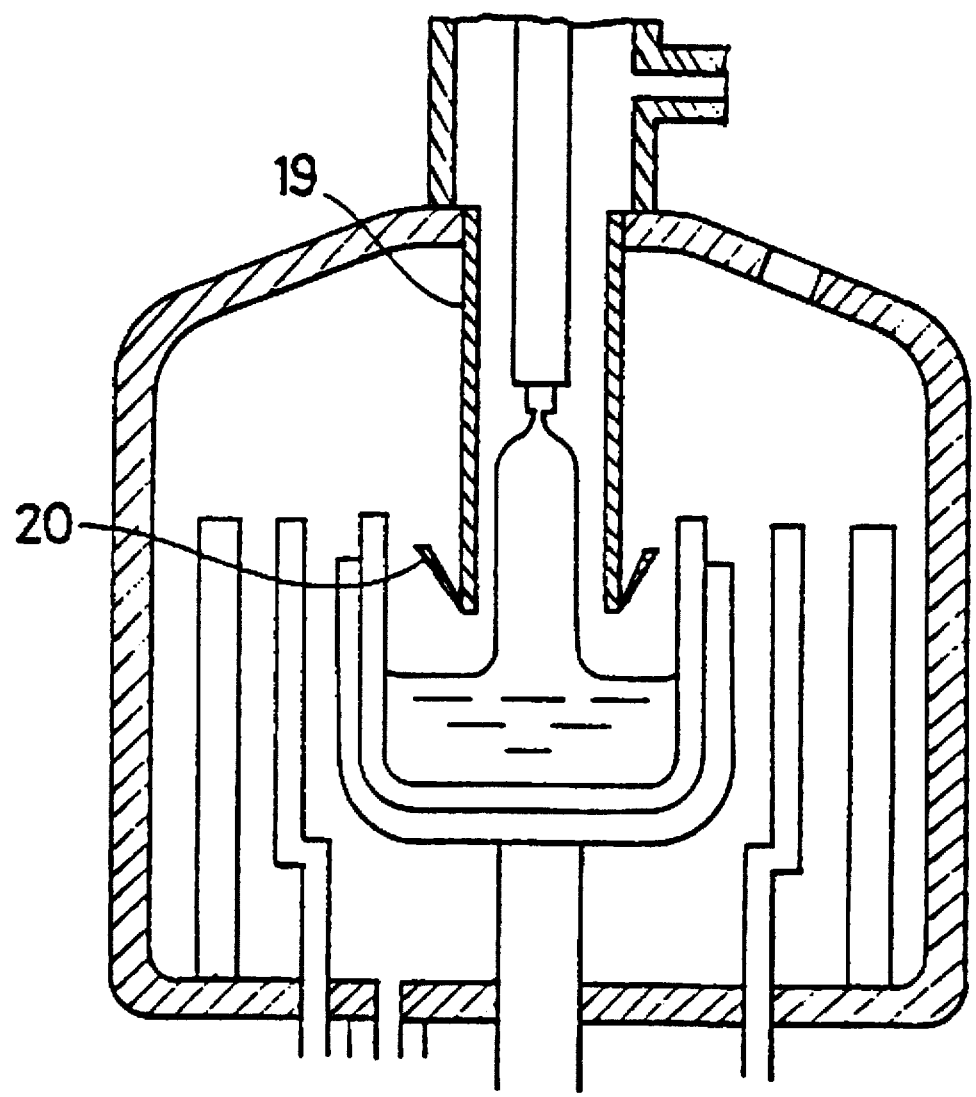
FIG. 5 is an illustration of a longitudinal section of another example of a conventional apparatus for producing single crystals.
Figure 6:
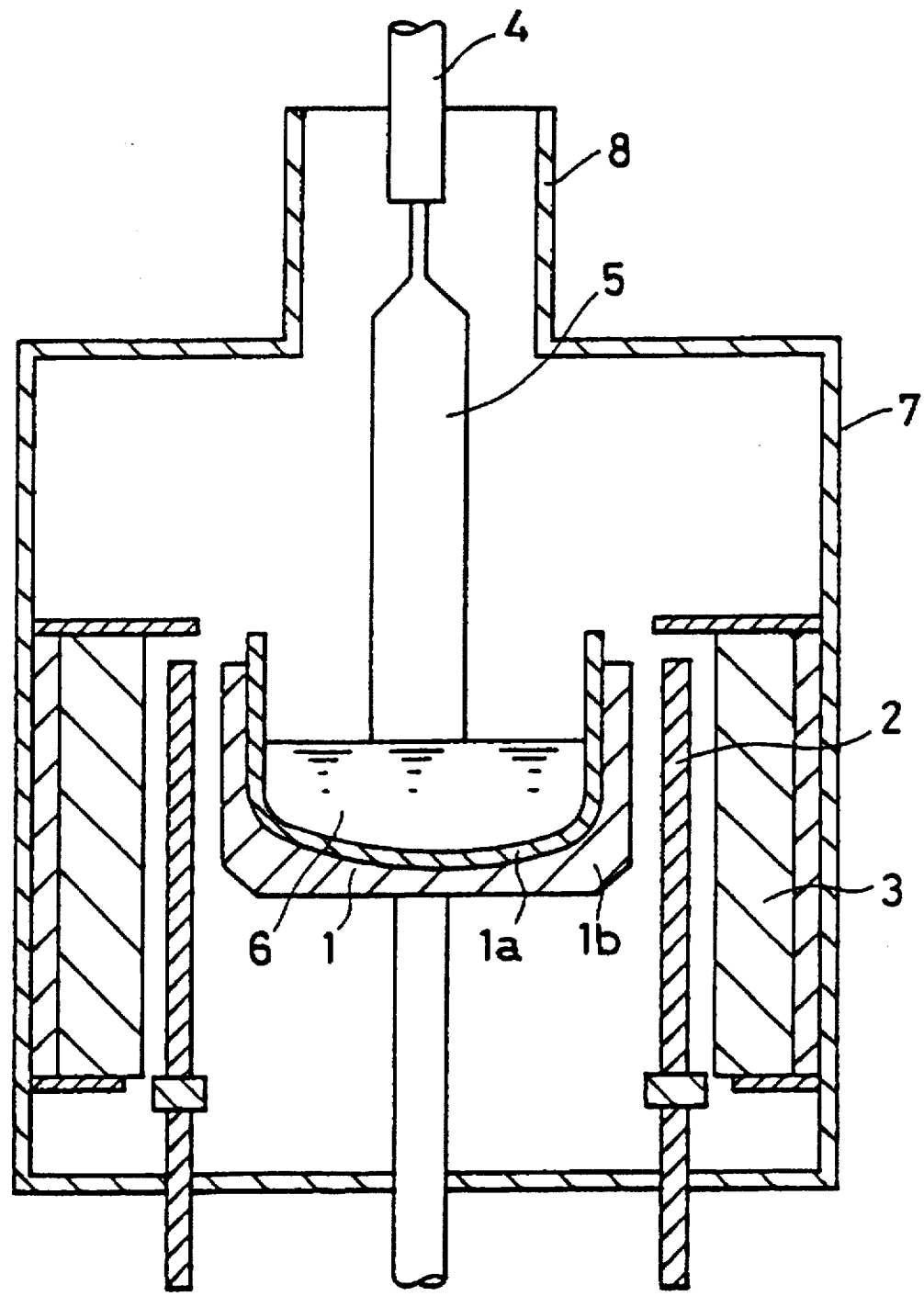
FIG. 6 is an illustration of a schematic cross section of a process for producing a single crystal in accordance with the Czochralski process.

Crystals grown under two other conditions were tested for comparison. An apparatus for comparison [1] was provided only with the protective gas inlet pipe (9) with a gap of 290 mm between its lower end and the surface of the melt (6). The heat resistant and heat insulating component (10) for crystal pulling was not used. The schematic diagram of the comparison [2] is illustrated in FIG. 4. It was provided only with the heat resistant and heat insulating component (10), the height of which was 280 mm (1.1 times as high as the crucible), all other provisions being equal to the apparatus of this invention.

The temperature gradient in the crystal during the pulling process was determined by inserting thermocouples into the single crystal (5). The results are shown in Table 1 for the temperature gradients at high temperature (about 1300° C.) and at low temperature (about 1000° C.).

TABLE 1

An average of measurements on 3 pulled rods is represented for each case.

| Examples | Temperature Gradient at High Temperature (1350° C.~1250° C.) | Temperature Gradient at Low Temperature (1100° C.~900° C.) | Note |
|---|---|---|---|
| This invention | 18° C./cm | 23° C./cm | |
| Comparison [1] | 23° C./cm | 19° C./cm | 1) |
| Comparison [2] | 30° C./cm | 21° C./cm | 2) |

1) Only protective gas inlet pipe was added.
2) Only heat resistant and heat insulating component was added.

It can be seen from Table 1 that the temperature gradients determined in the single crystals pulled in accordance with this invention is smaller at high temperature and larger at low temperature compared with the results for the cases of comparisons.

In addition, pulled single crystals were evaluated in terms of the yield ratio of the dislocation-free single crystals, the OSF acceptance ratio, and the acceptance ratio of dielectric strength of the gate oxide films. The yield ratio of the dislocation-free single crystals represents the ratio of the weight of the dislocation-free single crystals after excision of the portions containing dislocations to the weight of the charged source polycrystalline material. The OSF acceptance ratio is the ratio of the number of wafers of acceptable OSF to the total number of wafers produced with the criteria of acceptance to be less than the standard number of OSF defects (10/cm$^2$) after cutting silicon wafers, subjecting them to heat treatment at 780° C. for 3 Hr and at 1000° C. for 16 Hr, and selective etching. The acceptance ratio of the dielectric strength of the gate oxide films is defined in terms of a voltage ramping procedure with a gate electrode consisting of a phosphorus(P)-doped polycrystalline silicon with 250 Å thick dry oxide film and an area of 8 mm$^2$. The criteria for acceptance was ability to withstand dielectric strength above the standard value (8 Mv/cm of the mean electric field) before an avalanche. The result is represented by the ratio of the number of acceptable wafers to the number of wafers tested. The test results are shown in Table 2.

TABLE 2

An average of measurements on 12 pulled rods is represented for each case.

| No | Test Items | Acceptable Results with This Invention | Acceptable Results with Comparison 1 | Acceptable Results with Comparison 2 |
|---|---|---|---|---|
| 1 | Yield Ratio of Dislocation-Free Single Crystals | 79.0% | 65.3% | 77.8% |
| 2 | OSF Acceptance Ratio | 98.9% | 93.2% | 92.1% |
| 3 | Acceptance Ratio, Dielectric Strength of Gate Oxide Films | 85.3% | 61.4% | 51.8% |

It can be seen that silicon single crystals produced by the apparatus of this invention show better results in all items of tests than the single crystals by the apparatus of comparison, and, in particular, shows excellent performance with respect to dielectric strength of the gate oxide films.

As has been explained so far, the apparatus and the process for producing single crystals are characterized by simplicity in structure and easy of handling. In addition, the temperature gradient in the pulled single crystal along the direction of pulling can be adequately adjusted. Therefore, using the apparatus and the process in accordance with this invention, prevention of OSF defects in the single crystal substrates and improvement of the dielectric strength of the gate oxide films can be attained without loss of productivity of single-crystals.

What is claimed is:

1. In a process of producing single crystals by pulling up a single crystal from a melt of material of said single crystal in a crucible surrounded by a heating element outside said crucible through a heat resistant and heat insulating component connected to a lower part of a protective gas inlet pipe above said melt, the process is characterized by maintaining a small temperature gradient in a high temperature portion of a grown single crystal pulled from the melt and by maintaining a large temperature gradient in a low temperature portion of said grown single crystal.

2. A process of producing single crystals described in claim 1 which is characterized by having the high temperature portion in a high temperature range between 1350° C. and 1250° C., and the low temperature portion in a low temperature range between 1100° C. and 900° C.

3. A process of producing single crystals described in claim 1 which characteristically uses a cylindrical or downward narrowing conical cylindrical heat resistant and heat insulating component.

4. A process of producing single crystals described in claim 1 which characteristically uses a heat resistant and heat insulating component of graphite material.

5. A process of producing single crystals described in claim 1 which characteristically uses a heat resistant and heat insulating component surface coated with silicon carbide.

6. A process of producing single crystals described in claim 1 in which the heat resistant and heat insulating component is characteristically installed at the lower end or on the lower side of the protective gas inlet pipe in terms of the supporting components.

7. A process of producing single crystals described in claim 1 which characteristically uses the protective gas inlet pipe provided with a lifting mechanism, or a heat resistant and heat insulating component and a protective gas inlet pipe in which the mounting length of the supporting components holding said heat resistant and heat insulating component and said protective gas inlet pipe is variable, or a combination of them to make adjusting the position of installing said heat resistant and heat insulating component feasible.

8. A process of producing single crystals described in claim 1, wherein a flow rate of argon blown in through the protective gas inlet pipe is characterized by being constant.

9. A process of producing single crystals described in claim 1 which is characterized by being silicon single crystals.

10. In a process of producing single crystals by pulling up a single crystal from a melt of material of said single crystal in a crucible surrounded by a heating element outside said crucible through a heat resistant and heat insulating component connected to a lower part of a protective gas inlet pipe above said melt, the process is characterized by maintaining a small temperature gradient in a high temperature portion of a grown single crystal pulled from the melt and by maintaining a large temperature gradient in a low temperature portion of said grown single crystal, the protective gas inlet pipe being characteristically tightly connected to the inside surface of the water cooled chamber.

11. A method of producing single crystals in an apparatus comprising a chamber containing a crucible for containing a melt from which a single crystal is grown, a heating element for heating the melt, a pulling mechanism for growing the single crystal after contacting the melt with a seed crystal, a protective gas inlet pipe arranged to release heat by thermal conduction with the chamber, the protective gas inlet pipe extending downwardly into the chamber and surrounding the pulling mechanism, supporting components on a lower end of the protective gas inlet pipe, and a heat resistant and heat insulating component supported on the lower end of the protective gas inlet pipe by the supporting components, the heat resistant and heat insulating component surrounding a pulling zone of the single crystal above the melt in the crucible, the method comprising:

forming a melt of material in the crucible by heating the material with the heating element;

growing a single crystal by contacting the melt with the seed crystal and pulling the single crystal from the melt with the pulling mechanism; and providing a small temperature gradient along the single crystal with the heat resistant and heat insulating component and providing a high temperature gradient along the single crystal with the protective gas inlet pipe.

12. The method of claim 11, wherein the high temperature gradient is provided by maintaining an inner surface of the protective gas inlet pipe at a low temperature by heat dissipation to the chamber.

13. The method of claim 12, wherein the high temperature gradient is provided by minimizing heat dissipation from the heat resistant and heat insulating component to the protective gas inlet pipe by the supporting components, the heat resistant and heat insulating component having an inner surface which is maintained at a high temperature as a result of heat from a melt in the crucible and heat from the heating element.

14. The method of claim 11, wherein the heat resistant and heat insulating component maintains the small temperature gradient in a lower portion of the single crystal surrounded by the heat resistant and heat insulating component, the lower portion being at a temperature above 1250° C., and the protective gas inlet pipe maintains the high temperature gradient in an upper portion of the single crystal surrounded by the protective gas inlet pipe, the upper portion being at a temperature between 900° C.–1100° C.

15. The method of claim 11, wherein the heat resistant and heat insulating component is cylindrical or conically narrowing downward, the heat resistant and heat insulating component is made of graphite, and coated with silicon carbide, and the protective gas inlet pipe includes a lifting mechanism which raises and lowers the protective gas inlet pipe.

16. The method of claim 11, further comprising replacing the supporting components with supporting components which adjust a distance extending vertically between an outlet of the protective gas inlet pipe and an inlet of the heat resistant and heat insulating component.

17. The method of claim 11, further comprising blowing argon gas through the protective gas inlet pipe at a constant rate.

18. The method of claim 11, wherein the crucible contains a melt of silicon and the pulling mechanism pulls a silicon single crystal from the melt.

19. A method of producing single crystals in an apparatus comprising a chamber containing a crucible for containing a melt from which a single crystal is grown, a heating element for heating the melt, a pulling mechanism for growing the single crystal after contacting the melt with a seed crystal, a protective gas inlet pipe arranged to release heat by thermal conduction with the chamber, the protective gas inlet pipe extending downwardly into the chamber and surrounding the pulling mechanism, supporting components on a lower end of the protective gas inlet pipe, and a heat resistant and heat insulating component supported on the lower end of the protective gas inlet pipe by the supporting components, the heat resistant and heat insulating component surrounding a pulling zone of the single crystal above the melt in the crucible, the method comprising:

forming a melt of material in the crucible by heating the material with the heating element;

growing a single crystal by contacting the melt with the seed crystal and pulling the single crystal from the melt with the pulling mechanism; and providing a small temperature gradient along the single crystal with the heat resistant and heat insulating component and providing a high temperature gradient along the single crystal with the protective gas inlet pipe, the supporting components comprising a plurality of circumferentially spaced-apart components extending between an outer periphery of the protective gas inlet pipe and an upper end of the heat resistant and heat insulating component.

20. A method of producing single crystals in an apparatus comprising a chamber containing a crucible for containing a melt from which a single crystal is grown, a heating element for heating the melt, a pulling mechanism for growing the single crystal after contacting the melt with a seed crystal, a protective gas inlet pipe arranged to release heat by thermal conduction with the chamber, the protective gas inlet pipe extending downwardly into the chamber and surrounding the pulling mechanism, supporting components on a lower end of the protective gas inlet pipe, and a heat resistant and heat insulating component supported on the lower end of the protective gas inlet pipe by the supporting components, the heat resistant and heat insulating component surrounding a pulling zone of the single crystal above the melt in the crucible, the method comprising:

forming a melt of material in the crucible by heating the material with the heating element;

growing a single crystal by contacting the melt with the seed crystal and pulling the single crystal from the melt with the pulling mechanism; and providing a small temperature gradient along the single crystal with the heat resistant and heat insulating component and providing a high temperature gradient along the single crystal with the protective gas inlet pipe, an upper end of the heat resistant and heat insulating component being spaced vertically below the lower end of the protective gas inlet pipe.

* * * * *